(12) United States Patent
Yang et al.

(10) Patent No.: US 11,785,817 B2
(45) Date of Patent: Oct. 10, 2023

(54) DISPLAY PANEL

(71) Applicant: Wuhan China Star Optoelectronics Semiconductor Display Technology Co., Ltd., Wuhan (CN)

(72) Inventors: Weiwei Yang, Wuhan (CN); Chao Dai, Wuhan (CN); Cheng Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 760 days.

(21) Appl. No.: 16/957,378

(22) PCT Filed: Apr. 1, 2020

(86) PCT No.: PCT/CN2020/082692
§ 371 (c)(1),
(2) Date: Jun. 24, 2020

(87) PCT Pub. No.: WO2021/174623
PCT Pub. Date: Sep. 10, 2021

(65) Prior Publication Data
US 2023/0102432 A1    Mar. 30, 2023

(30) Foreign Application Priority Data
Mar. 5, 2020  (CN) .......................... 202010147355.9

(51) Int. Cl.
*H10K 59/131* (2023.01)
*H10K 59/65* (2023.01)

(52) U.S. Cl.
CPC ......... *H10K 59/1315* (2023.02); *H10K 59/65* (2023.02)

(58) Field of Classification Search
CPC .......................... H10K 59/1315; H10K 59/65
(Continued)

(56) References Cited

U.S. PATENT DOCUMENTS 10,416,819 B2   9/2019  Cho
2022/0157245 A1*  5/2022  Jo .......................... G09G 3/3208

FOREIGN PATENT DOCUMENTS

CN    106708324 A    5/2017
CN    106873266 A    6/2017
(Continued)

OTHER PUBLICATIONS

International Search Report in International application No. PCT/CN2020/082692, dated Oct. 28, 2020.
(Continued)

*Primary Examiner* — Xia L Cross
(74) *Attorney, Agent, or Firm* — PV IP PC; Wei Te Chung; Zhigang Ma

(57) ABSTRACT

The present disclosure provides a display panel including a display area, a ring-shaped wiring area, and a light-transmitting area. The display panel further includes a first metal layer, a second metal layer, a third metal layer, and an anode layer. The first metal layer includes a first scan line wired in the ring-shaped wiring area. The second metal layer includes a first bridge line. The third metal layer includes a first data line wired in the ring-shaped wiring area. The anode layer includes a second bridge line. The first data line is bridged with the first bridge line. The first scan line is bridged with the second bridge line.

18 Claims, 3 Drawing Sheets

(58) Field of Classification Search
USPC .......................................................... 257/40
See application file for complete search history.

(56) References Cited

FOREIGN PATENT DOCUMENTS

| | | |
|---|---|---|
| CN | 206400518 U | 8/2017 |
| CN | 109981855 A | 7/2019 |
| CN | 110007804 A | 7/2019 |

OTHER PUBLICATIONS

Written Opinion of the International Search Authority in International application No. PCT/CN2020/082692, dated Oct. 28, 2020.

* cited by examiner

DISPLAY PANEL

RELATED APPLICATIONS

This application is a National Phase of PCT Patent Application No. PCT/CN2020/082692 having International filing date of Apr. 1, 2020, which claims the benefit of priority of Chinese Patent Application No. 202010147355.9 filed on Mar. 5, 2020. The contents of the above applications are all incorporated by reference as if fully set forth herein in their entirety.

FIELD AND BACKGROUND OF THE INVENTION

The present disclosure relates to a technical field of display, and particularly to a display panel.

Organic light-emitting diodes (OLEDs) are more widely used due to their advantages of light weight, self-illumination, wide viewing angles, low driving voltage, high luminous efficiency, low power consumption, and fast response times. Full screen is one of goals of development of OLED display technology, which can be achieved by digging a hole in a screen and installing a camera device in the hole. However, after digging the hole in the screen, array wires need to bypass the hole to work properly. Due to many wires involved, a width of a wiring area around the camera is relatively large, which greatly reduces a screen ratio of a full screen. Moreover, difference in resistance between different metal layers is large, which may cause abnormal display.

Therefore, the current technology has defects and needs to be improved urgently.

SUMMARY OF THE INVENTION

The present disclosure provides a display panel configured to improve a wiring distribution in an area around a front camera to reduce a width of a wiring area, so as to solve the problem that an area occupied by a camera is too large in the prior art.

In order to solve the above problem, the present disclosure provides the following technical solutions.

The present disclosure provides a display panel comprising a light-transmitting area, a ring-shaped wiring area disposed around the light-transmitting area, and a display area disposed around the ring-shaped wiring area. The display panel further comprises a first metal layer, a second metal layer, a third metal layer, and an anode layer spaced apart by insulating layers in the ring-shaped wiring area. The first metal layer comprises a gate electrode, and a scan line comprising a first scan line wired in the ring-shaped wiring area. The second metal layer comprises an electrode plate forming a capacitance with the gate electrode, and a first bridge line disposed in the ring-shaped wiring area. The third metal layer comprises source/drain electrodes, and a data line comprising a first data line wired in the ring-shaped wiring area. The anode layer comprises an anode electrode, and a second bridge line disposed in the ring-shaped wiring area. The first data line is bridged with the first bridge line. The first scan line is bridged with the second bridge line.

In the display panel, the first scan line and the first data line are disconnected in the ring-shaped wiring area. The first data line is bridged with the first bridge line. The first scan line is bridged with the second bridge line. The scan line further comprises a second scan line wired in the ring-shaped wiring area. The data line further comprises a second data line wired in the ring-shaped wiring area.

In the display panel, a portion of the second data line in the ring-shaped wiring area is arranged around the light-transmitting area. A portion of the second scan line in the ring-shaped wiring area is arranged around the light-transmitting area.

In the display panel, the first bridge line is connected to the first data line through a first via hole. The second bridge line is connected to the first scan line through a second via hole.

In the display panel, the insulating layers comprise:
a gate insulating layer disposed between the first metal layer and the second metal layer;
an interlayer insulating layer disposed between the second metal layer and the third metal layer; and
a planarization layer disposed between the third metal layer and the anode layer; and
wherein the first via hole penetrates the interlayer insulating layer, and the second via hole penetrates the gate insulating layer, the interlayer insulating layer, and the planarization layer.

In the display panel, in the ring-shaped wiring area, the first bridge line overlaps the second data line in a direction perpendicular to the display panel, and the second bridge line overlaps the second scan line in the direction perpendicular to the display panel.

In the display panel, in the ring-shaped wiring area, the second data line partially overlaps the second scan line, and orthographic projections of the second data line, the second scan line, the first bridge line, and the second bridge line on a substrate fall within a same arc line.

In the display panel, the second metal layer and the third metal layer are composed of a same material.

In the display panel, a difference between a block resistance of the data line and a block resistance of the first bridge line is less than or equal to 0.15Ω. A difference between a block resistance of the scan line and a block resistance of the second bridge line is less than or equal to 0.2Ω.

The present disclosure further provides a display panel comprising a light-transmitting area, a water-oxygen blocking layer disposed around the light-transmitting area, a ring-shaped wiring area disposed around the water-oxygen blocking layer, and a display area disposed around the ring-shaped wiring area. The display panel further comprises a first metal layer, a second metal layer, a third metal layer, and an anode layer spaced apart by insulating layers in the ring-shaped wiring area. The first metal layer comprises a gate electrode, and a scan line comprising a first scan line wired in the ring-shaped wiring area. The second metal layer comprises an electrode plate forming a capacitance with the gate electrode, and a first bridge line disposed in the ring-shaped wiring area. The third metal layer comprises source/drain electrodes, and a data line comprising a first data line wired in the ring-shaped wiring area. The anode layer comprises an anode electrode, and a second bridge line disposed in the ring-shaped wiring area. The first data line is bridged with the first bridge line. The first scan line is bridged with the second bridge line.

In the display panel, the first scan line and the first data line are disconnected in the ring-shaped wiring area. The first data line is bridged with the first bridge line. The first scan line is bridged with the second bridge line. The scan line further comprises a second scan line wired in the ring-shaped wiring area. The data line further comprises a second data line wired in the ring-shaped wiring area.

In the display panel, a portion of the second data line in the ring-shaped wiring area is arranged around the light-transmitting area. A portion of the second scan line in the ring-shaped wiring area is arranged around the light-transmitting area.

In the display panel, the first bridge line is connected to the first data line through a first via hole. The second bridge line is connected to the first scan line through a second via hole.

In the display panel, the insulating layers comprise:

a gate insulating layer disposed between the first metal layer and the second metal layer;

an interlayer insulating layer disposed between the second metal layer and the third metal layer; and a planarization layer disposed between the third metal layer and the anode layer; and wherein the first via hole penetrates the interlayer insulating layer, and the second via hole penetrates the gate insulating layer, the interlayer insulating layer, and the planarization layer.

In the display panel, in the ring-shaped wiring area, the first bridge line overlaps the second data line in a direction perpendicular to the display panel, and the second bridge line overlaps the second scan line in the direction perpendicular to the display panel.

In the display panel, in the ring-shaped wiring area, the second data line partially overlaps the second scan line, and orthographic projections of the second data line, the second scan line, the first bridge line, and the second bridge line on a substrate fall within a same arc line.

In the display panel, the second metal layer and the third metal layer are composed of a same material.

In the display panel, a difference between a block resistance of the data line and a block resistance of the first bridge line is less than or equal to 0.15Ω. A difference between a block resistance of the scan line and a block resistance of the second bridge line is less than or equal to 0.2Ω.

In the display panel provided by the present disclosure, the material used for the first metal layer and the material used for the anode layer are same or have similar resistances, and the material used for the second metal layer and the material used for the third metal layer are same or have similar resistances, which can prevent abnormal display. In the ring-shaped wiring area, the first bridge line and the first data line are connected through the first via holes, the second bridge line and the first scan line are connected through the second via holes, the second data line and the first bridge line on different layers overlap each other, and the second scan line and the second bridge line on different layers overlap each other, which can ensure that the ring wiring area has a narrow width. The display panel provided by the present disclosure saves two masks, reduces a width of a wiring area, and improves screen display effect.

BRIEF DESCRIPTION OF THE SEVERAL VIEWS OF THE DRAWINGS

In order to more clearly illustrate technical solutions in embodiments or the prior art, a brief description of accompanying drawings used in the description of the embodiments or the prior art will be given below. Obviously, the accompanying drawings in the following description are merely some embodiments of the present disclosure. For those skilled in the art, other drawings may be obtained from these accompanying drawings without creative labor.

DESCRIPTION OF SPECIFIC EMBODIMENTS OF THE INVENTION

Figure 1:
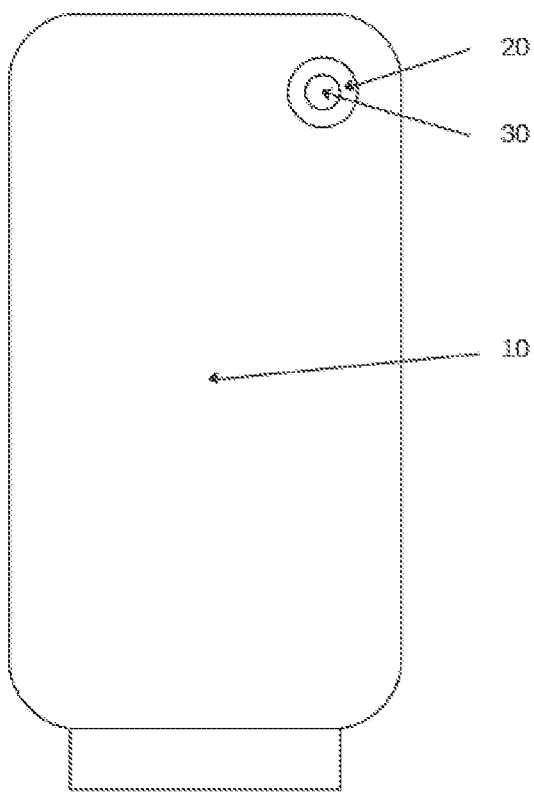
FIG. 1 is a schematic structural diagram of a display panel according to an embodiment of the present disclosure.

The following description of various embodiments of the present disclosure with reference to the accompanying drawings is used to illustrate specific embodiments that can be practiced. Directional terms mentioned in the present disclosure, such as "above", "below", "front", "rear", "left", "right", "inside", "outside", "side", are merely used to indicate the direction of the accompanying drawings. Therefore, the directional terms are used for illustrating and understanding the present disclosure rather than limiting the present disclosure. In the figures, elements with similar structures are indicated by the same reference numerals.

In the current technology, full screen can be achieved by digging a hole in a screen and installing a camera device in the hole. However, after digging the hole in the screen, array wires need to bypass the hole to work properly. Due to many wires involved, a width of a wiring area around the camera is relatively large, which greatly reduces a screen ratio of a full screen. Moreover, difference in resistance between different metal layers is large, which may cause abnormal display. The embodiments of the present disclosure can solve the above defects.

As shown in FIG. 1, an embodiment of the present disclosure provides a display panel comprising a display area 10, a ring-shaped wiring area 20, and a light-transmitting area 30. The ring-shaped wiring area 20 is disposed around the light-transmitting area 30. The display area 10 is disposed around the ring-shaped wiring area 20. A position of a back of the display panel corresponding to the light transmitting area 30 is provided with an under-screen camera. The under-screen camera receives light through the light-transmitting area 30.

Figure 2:
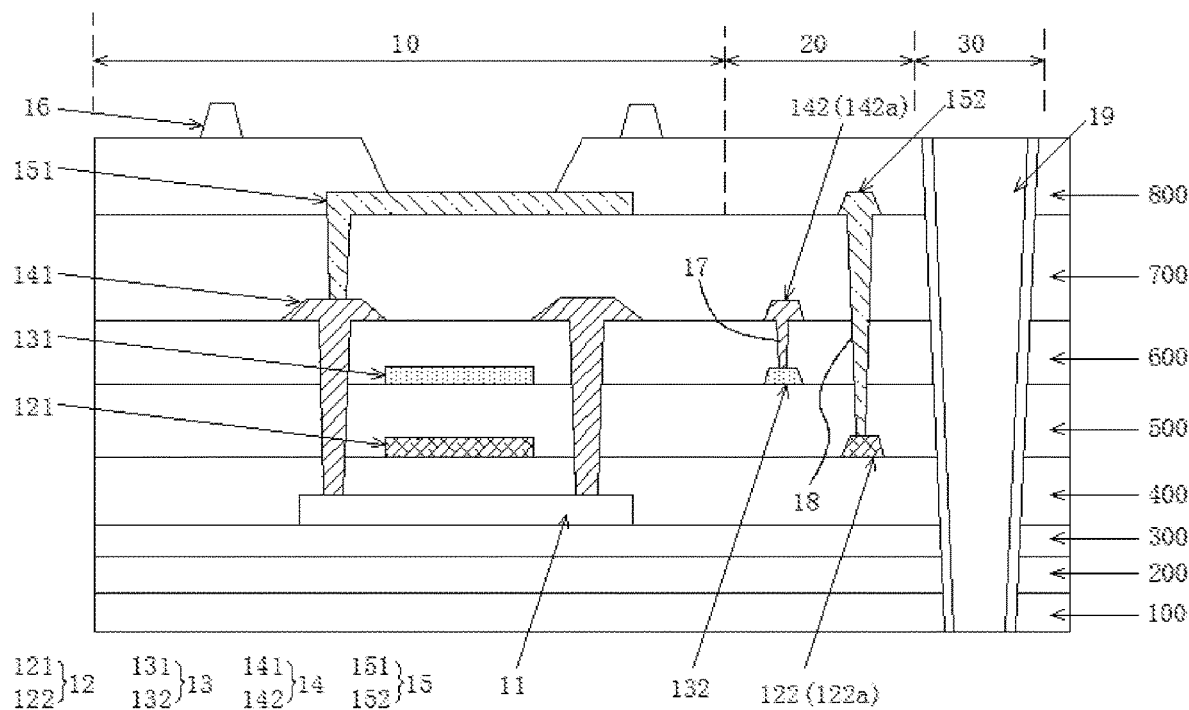
FIG. 2 is a schematic cross-sectional view of the display panel according to the embodiment of the present disclosure.

Please refer to FIG. 2, which is a schematic cross-sectional view of the display panel according to the embodiment of the present disclosure. The display panel comprises a first metal layer 12, a second metal layer 13, a third metal layer 14, and an anode layer 15 spaced apart by insulating layers in the ring-shaped wiring area. The display panel is provided with a blind/through hole 19 partially penetrating or penetrating the insulating layers in the light-transmitting area 30.

Specifically, the display panel comprises a substrate 100 and the insulating layers on the substrate 100. The insulating layers comprise, but are not limited to, a barrier layer 200, a buffer layer 300, a first gate insulating layer 400, a second gate insulating layer 500, an interlayer insulating layer 600, a planarization layer 700, and a pixel defining layer 800 that are sequentially stacked. The display panel further comprises a patterned active layer 11 disposed on the buffer layer 300. The first metal layer 12 is disposed on the first gate insulating layer 400. The second gate insulating layer 500 is disposed between the first metal layer 12 and the second metal layer 13. The interlayer insulating layer 600 is disposed between the second metal layer 13 and the third metal layer 14. The planarization layer 700 is disposed between the third metal layer 14 and the anode layer 15. A patterned spacer 16 is disposed on the pixel defining layer 800.

In an embodiment, the first metal layer 12 comprises a gate electrode 121 and a scan line 122. The scan line 122 comprises a first scan line 122a wired in the ring-shaped wiring area 20. The second metal layer 13 comprises an electrode plate 131 forming a capacitance with the gate electrode 121, and a first bridge line 132 disposed in the ring-shaped wiring area 20. The third metal layer 14 comprises source/drain electrodes 141 and a data line 142. The data line 142 comprises a first data line 142a wired in the ring-shaped wiring area 20. The anode layer 15 comprises an anode electrode 151, and a second bridge line 152 disposed in the ring-shaped wiring area 20. The first data line 142a is bridged with the first bridge line 132, and the first scan line 122a is bridged with the second bridge line 152.

A material used for the first metal layer 12 and a material used for the anode layer 15 have similar resistances. A material used for the second metal layer 13 and a material used for the third metal layer 14 are same or have similar resistances. That is, a material used for the first scan line 122a and a material used for the second bridge line 152 have similar resistances, and a material used for the first data line 142a and a material used for the first bridge line 132 are same or have similar resistances. Therefore, the problem of abnormal display due to difference in resistance between different metal layers when bridging the different metal layers can be solved, thereby improving screen display effect.

Figure 3:
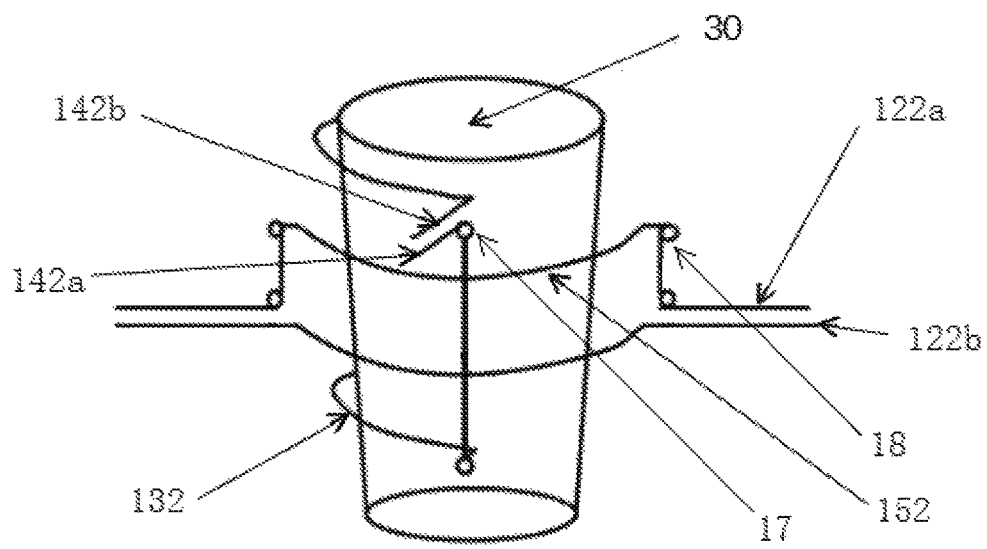
FIG. 3 is a schematic structural diagram of a ring-shaped wiring area of the display panel according to the embodiment of the present disclosure.

Please refer to FIG. 2 and FIG. 3. In another embodiment, the first metal layer 12 comprises a patterned gate electrode 121 and a scan line 122. The gate electrode 121 is disposed corresponding to the active layer 11. A part of the scan line 122 bypasses the light-transmitting area 30 and is wired in the ring-shaped wiring area 20, and the remaining part extends toward the display area 10. The scan line 122 wired in the ring-shaped wiring area 20 comprises a first scan line 122a and a second scan line 122b. In this embodiment, there are one or more first scan lines 122a and one or more second scan lines 122b. Due to actual demand for a diameter of the blind/through hole 19, a plurality of the first scan lines 122a and a plurality of the second scan lines 122b are often required to be wired in the ring-shaped wiring area 20.

The second metal layer 13 comprises an electrode plate 131 forming a capacitance with the gate electrode 121, and a first bridge line 132 disposed in the ring-shaped wiring area 20.

The third metal layer 14 comprises patterned source/drain electrodes 141 and a data line 142. The source/drain electrodes 141 are electrically connected to the active layer 11 through via holes penetrating the first gate insulating layer 400, the second gate insulating layer 500, and the interlayer insulating layer 600. The data line 142 crosses the scan line 122 in an insulated manner. A part of the data line 142 bypasses the light-transmitting area 30 and is wired in the ring-shaped wiring area 20. The data line 142 wired in the ring-shaped wiring area 20 comprises a first data line 142a and a second data line 142b. In this embodiment, there are one or more first data lines 142a and one or more second data lines 142b. Due to actual demand for a diameter of the blind/through hole 19, a plurality of the first data lines 142a and a plurality of the second data lines 142b are often required to be wired in the ring-shaped wiring area 20.

The anode layer 15 comprises a patterned anode electrode 151 and a second bridge line 152 disposed in the ring-shaped wiring area 20. The anode electrode 151 is connected to the drain electrode 141 through a via hole penetrating the planarization layer 700.

Please refer to FIG. 3, which is a schematic structural diagram of a ring-shaped wiring area of the display panel according to the embodiment of the present disclosure. FIG. 3 is only used to illustrate a wiring design of the ring-shaped wiring area. In this embodiment, the first scan line 122a and the first data line 142a are disconnected in the ring-shaped wiring area 20. The disconnected first data line 142a is electrically connected to both ends of the first bridge line 132 through first via holes 17 in a manner of bridge connection. The disconnected first scan line 122a is electrically connected to both ends of the second bridge line 152 through second via holes 18 in a manner of bridge connection.

The first bridge line 132 and the second bridge line 152 are arranged in curved lines around the light-transmitting area 30 in the ring-shaped wiring area 20.

In this embodiment, a portion of the second data line 142b and a portion of the second scan line 122b outside the ring-shaped wiring area 20 are arranged in straight lines, but are not limited thereto. A portion of the second data line 142b and a portion of the second scan line 122b in the ring-shaped wiring area 20 are arranged in curved lines around the ring-shaped wiring area 20.

In this embodiment, the first metal layer 12 is composed of, but is not limited to, molybdenum (Mo). The second metal layer 13 is composed of, but is not limited to, one or more alloys such as titanium/aluminum/titanium (Ti/Al/Ti), or a single-layer or multi-layer structure of other aluminum-based materials. The third metal layer 14 is composed of, but is not limited to, one or more alloy such as titanium/aluminum/titanium (Ti/Al/Ti). The anode layer 15 is composed of, but is not limited to, one or more of indium tin oxide (ITO), indium zinc oxide (IZO), zinc oxide (ZnO), indium oxide ($In_2O_3$), indium gallium oxide (IGO), zinc aluminum oxide (AZO), and argentum (Ag).

In this embodiment, a material used for the first metal layer 12 and a material used for the anode layer 15 have similar resistances. A material used for the second metal layer 13 and a material used for the third metal layer 14 are same or have similar resistances. That is, a material used for the first scan line 122a, a material used for the second scan line 122b, and a material used for the second bridge line 152 have similar resistances. And, a material used for the first data line 142a, a material used for the second data line 142b, and a material used for the first bridge line 132 are same or have similar resistances.

In this embodiment, a difference between a block resistance of the first scan line 122a (the second scan line 122b) and a block resistance of the second bridge line 152 is less than or equal to 0.2Ω. A difference between a block resistance of the first data line 142a (the second data line 142b) and a block resistance of the first bridge line 132 is less than or equal to 0.15Ω.

Specifically, in this embodiment, the difference between the block resistance of the first scan line 122a (the second scan line 122b) and the block resistance of the second bridge line 152 is less than or equal to 0.1Ω. The difference between the block resistance of the first data line 142a (the second data line 142b) and the block resistance of the first bridge line 132 is less than or equal to 0.05Ω.

In this embodiment, the block resistance of the second bridge line 152 bridged with the first scan line 122a is same as or similar to the block resistance of the first scan line 122a. And, the block resistance of the first bridge line 132 bridged with the first data line 142a is same as or similar to the block resistance of the first data line 142a. Therefore, the problem of abnormal display due to difference in resistance between different metal layers when bridging the different metal layers can be solved, thereby improving screen display effect.

In addition, in this embodiment, a water-oxygen blocking layer is further provided around the blind/through hole 19, which can effectively enhance durability and reliability of the display panel.

Figure 4:
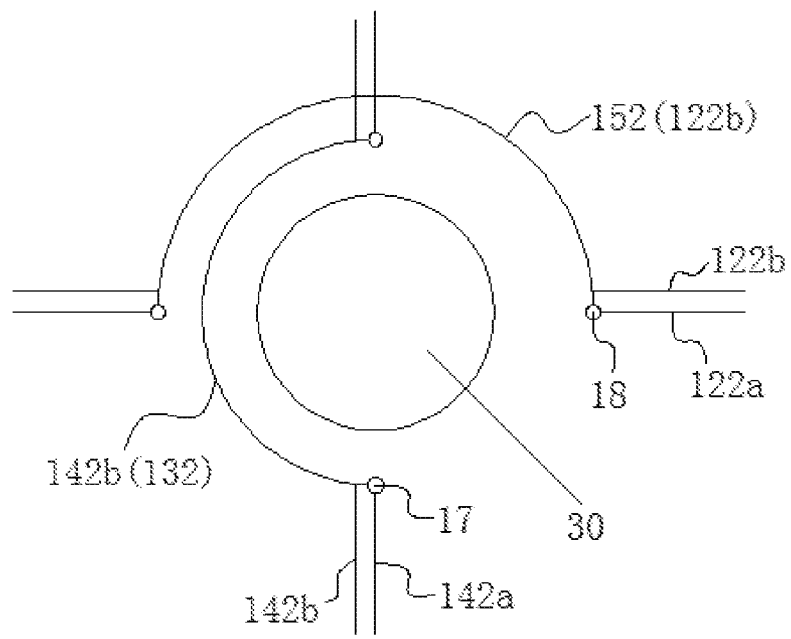
FIG. 4 is a top view of a ring-shaped wiring area of a display panel according to a first embodiment of the present disclosure.

Please refer to FIG. 4, which is a top view of a ring-shaped wiring area of a display panel according to a first embodiment of the present disclosure. In this embodiment, the portion of the second data line 142b in the ring-shaped wiring area 20 overlaps the first bridge line 132 in a direction perpendicular to the display panel. The portion of the second scan line 122b in the ring-shaped wiring area 20 overlaps the second bridge line 152 in the direction perpendicular to the display panel. That is, an orthographic projection of the portion of the second data line 142b in the ring-shaped wiring area 20 on the substrate coincides with an orthographic projection of the first bridge line 132 on the substrate. An orthographic projection of the portion of second scan line 122b in the ring-shaped wiring area 20 on the substrate coincides with an orthographic projection of the second bridge line 152 on the substrate.

The data line 142, the first bridge line 132, the scan line 122, and the second bridge line 152 are not on a same layer, and the first via holes 17 and the second via holes 18 are distributed at intervals, so there is no influence, such as short circuit and signal interference, on such a circuit.

In this embodiment, by overlapping every two wires of different layers in the above manner, a width of the ring-shaped wiring area 20 can be effectively reduced, thereby improving screen ratio and display effect.

In another embodiment, the portion of the second data line 142b in the ring-shaped wiring area 20 partially overlaps or interleaves with the first bridge line 132. The second scan line 122b and the second bridge line 152 also adopt a similar design. Due to use of double-layer wiring structure, compared with wiring the scanning line 122/the data line 142 at a same layer, the width of the ring-shaped wiring area 20 can be effectively reduced, thereby improving screen ratio and display effect.

Figure 5:
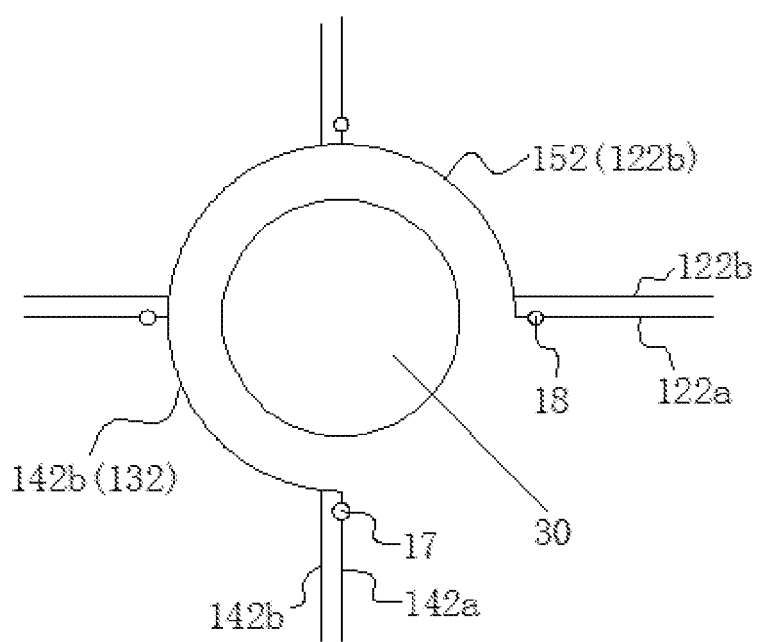
FIG. 5 is a top view of a ring-shaped wiring area of a display panel according to a second embodiment of the present disclosure.

Please refer to FIG. 5, which is a top view of a ring-shaped wiring area of a display panel according to a second embodiment of the present disclosure. This embodiment differs from the above first embodiment in that: in a direction perpendicular to the substrate, the portion of the second data line 142b in the ring-shaped wiring area 20 overlaps the portion of the second scan line 122b in the ring-shaped wiring area 20. That is, the orthographic projections of the second data line 142b, the first bridge line 132, the second scan line 122b, and the second bridge line 152 on the substrate fall within a same arc line.

Orthographic projections of the first via holes 17 and the second via holes 18 on the substrate do not fall within an overlapping range of the orthographic projections of the second data line 142b, the first bridge line 132, the second scan line 122b, and the second bridge line 152 on the substrate. That is, the ends of the first bridge line 132 and the second bridge line 152 are respectively provided with straight extension leads, and are respectively bridged with the first data line 142a and the first scan line 122a by the extension leads through the first via holes 17 and the second via holes 18.

In this embodiment, overlapping four types of wires in the ring-shaped wiring area 20 can effectively reduce the width of the ring-shaped wiring area 20, thereby improving screen ratio and display effect.

The data line 142, the first bridge line 132, the scan line 122, and the second bridge line 152 are not on a same layer so there is no influence, such as short circuit and signal interference, on such a circuit.

The display panel of the present disclosure further comprises conventional layers such as an organic light-emitting layer, a cathode layer, and an encapsulation layer, but is not limited thereto.

In the above, in the present disclosure, the material used for the first metal layer and the material used for the anode layer are same or have similar resistances, and the material used for the second metal layer and the material used for the third metal layer are same or have similar resistances, which can avoid abnormal display. In the ring-shaped wiring area, the second data line overlaps the first bridge line, and the second scan line overlaps the second bridge line, which can ensure that the ring wiring area has a narrow width. The first bridge line is formed by a patterning process of the second metal layer, and the second bridge line is formed through a patterning process of the anode layer, which can save two masks. The display panel provided by the present disclosure saves two masks, reduces a width of a wiring area, and improves screen display effect.

The present application has been described in the above preferred embodiments, but the preferred embodiments are not intended to limit the scope of the present application, and those skilled in the art may make various modifications without departing from the scope of the present application. The scope of the present application is determined by claims.

What is claimed is:

1. A display panel, comprising a light-transmitting area, a ring-shaped wiring area disposed around the light-transmitting area, and a display area disposed around the ring-shaped wiring area, and further comprising a first metal layer, a second metal layer, a third metal layer, and an anode layer spaced apart by insulating layers in the ring-shaped wiring area, wherein the first metal layer comprises a gate electrode, and a scan line comprising a first scan line wired in the ring-shaped wiring area;

the second metal layer comprises an electrode plate forming a capacitance with the gate electrode, and a first bridge line disposed in the ring-shaped wiring area;

the third metal layer comprises source/drain electrodes, and a data line comprising a first data line wired in the ring-shaped wiring area;

the anode layer comprises an anode electrode, and a second bridge line disposed in the ring-shaped wiring area; and the first data line is bridged with the first bridge line, and the first scan line is bridged with the second bridge line.

2. The display panel according to claim 1, wherein the first scan line and the first data line are disconnected in the ring-shaped wiring area, the first data line is bridged with the first bridge line, and the first scan line is bridged with the second bridge line.

3. The display panel according to claim 1, wherein the scan line further comprises a second scan line wired in the ring-shaped wiring area, the data line further comprises a second data line wired in the ring-shaped wiring area, a portion of the second data line in the ring-shaped wiring area is arranged around the light-transmitting area, and a portion of the second scan line in the ring-shaped wiring area is arranged around the light-transmitting area.

4. The display panel according to claim 3, wherein in the ring-shaped wiring area, the first bridge line overlaps the second data line in a direction perpendicular to the display panel, and the second bridge line overlaps the second scan line in the direction perpendicular to the display panel.

5. The display panel according to claim 4, wherein in the ring-shaped wiring area, the second data line partially overlaps the second scan line, and orthographic projections of the second data line, the second scan line, the first bridge line, and the second bridge line on a substrate fall within a same arc line.

6. The display panel according to claim 1, wherein the first bridge line is connected to the first data line through a first via hole, and the second bridge line is connected to the first scan line through a second via hole.

7. The display panel according to claim 6, wherein the insulating layers comprise:
 a gate insulating layer disposed between the first metal layer and the second metal layer;
 an interlayer insulating layer disposed between the second metal layer and the third metal layer; and
 a planarization layer disposed between the third metal layer and the anode layer;
 wherein the first via hole penetrates the interlayer insulating layer, and the second via hole penetrates the gate insulating layer, the interlayer insulating layer, and the planarization layer.

8. The display panel according to claim 1, wherein the second metal layer and the third metal layer are composed of a same material.

9. The display panel according to claim 1, wherein a difference between a block resistance of the data line and a block resistance of the first bridge line is less than or equal to $0.15\Omega$, and a difference between a block resistance of the scan line and a block resistance of the second bridge line is less than or equal to $0.2\Omega$.

10. A display panel, comprising a light-transmitting area, a water-oxygen blocking layer disposed around the light-transmitting area, a ring-shaped wiring area disposed around the water-oxygen blocking layer, and a display area disposed around the ring-shaped wiring area, and further comprising a first metal layer, a second metal layer, a third metal layer, and an anode layer spaced apart by insulating layers in the ring-shaped wiring area, wherein
 the first metal layer comprises a gate electrode, and a scan line comprising a first scan line wired in the ring-shaped wiring area;
 the second metal layer comprises an electrode plate forming a capacitance with the gate electrode, and a first bridge line disposed in the ring-shaped wiring area;
 the third metal layer comprises source/drain electrodes, and a data line comprising a first data line wired in the ring-shaped wiring area;
 the anode layer comprises an anode electrode, and a second bridge line disposed in the ring-shaped wiring area; and
 the first data line is bridged with the first bridge line, and the first scan line is bridged with the second bridge line.

11. The display panel according to claim 10, wherein the first scan line and the first data line are disconnected in the ring-shaped wiring area 20, the first data line is bridged with the first bridge line, and the first scan line is bridged with the second bridge line.

12. The display panel according to claim 10, wherein the scan line further comprises a second scan line wired in the ring-shaped wiring area, the data line further comprises a second data line wired in the ring-shaped wiring area, a portion of the second data line in the ring-shaped wiring area is arranged around the light-transmitting area, and a portion of the second scan line in the ring-shaped wiring area is arranged around the light-transmitting area.

13. The display panel according to claim 12, wherein in the ring-shaped wiring area, the first bridge line overlaps the second data line in a direction perpendicular to the display panel, and the second bridge line overlaps the second scan line in the direction perpendicular to the display panel.

14. The display panel according to claim 13, wherein in the ring-shaped wiring area, the second data line partially overlaps the second scan line, and orthographic projections of the second data line, the second scan line, the first bridge line, and the second bridge line on a substrate fall within a same arc line.

15. The display panel according to claim 10, wherein the first bridge line is connected to the first data line through a first via hole, and the second bridge line is connected to the first scan line through a second via hole.

16. The display panel according to claim 15, wherein the insulating layers comprise:
 a gate insulating layer disposed between the first metal layer and the second metal layer;
 an interlayer insulating layer disposed between the second metal layer and the third metal layer; and
 a planarization layer disposed between the third metal layer and the anode layer;
 wherein the first via hole penetrates the interlayer insulating layer, and the second via hole penetrates the gate insulating layer, the interlayer insulating layer, and the planarization layer.

17. The display panel according to claim 10, wherein the second metal layer and the third metal layer are composed of a same material.

18. The display panel according to claim 10, wherein a difference between a block resistance of the data line and a block resistance of the first bridge line is less than or equal to $0.15\Omega$, and a difference between a block resistance of the scan line and a block resistance of the second bridge line is less than or equal to $0.2\Omega$.

* * * * *